United States Patent
Horng et al.

(10) Patent No.: US 7,264,974 B2
(45) Date of Patent: Sep. 4, 2007

(54) METHOD FOR FABRICATING A LOW RESISTANCE TMR READ HEAD

(75) Inventors: Cheng T. Horng, San Jose, CA (US); Ru-Ying Tong, San Jose, CA (US)

(73) Assignee: Headway Technologies, Inc., Milpitas, CA (US)

(*) Notice: Subject to any disclaimer, the term of this patent is extended or adjusted under 35 U.S.C. 154(b) by 93 days.

(21) Appl. No.: 10/768,917

(22) Filed: Jan. 30, 2004

(65) Prior Publication Data

US 2005/0170532 A1  Aug. 4, 2005

(51) Int. Cl.
H01L 21/00  (2006.01)

(52) U.S. Cl. .................... 438/3; 438/238; 438/381

(58) Field of Classification Search .............. 438/3
See application file for complete search history.

(56) References Cited

U.S. PATENT DOCUMENTS

| | | | | |
|---|---|---|---|---|
| 5,316,982 | A * | 5/1994 | Taniguchi | 438/396 |
| 5,901,018 | A | 5/1999 | Fontana, Jr. et al. | 360/104 |
| 6,072,382 | A | 6/2000 | Daughton et al. | 338/32 R |
| 6,226,160 | B1 | 5/2001 | Gallagher et al. | 360/324.2 |
| 6,341,053 | B1 | 1/2002 | Nakada et al. | 360/324.2 |
| 6,411,478 | B1 | 6/2002 | Mao et al. | 360/324.2 |
| 6,420,230 | B1 * | 7/2002 | Derderian et al. | 438/255 |
| 6,462,541 | B1 | 10/2002 | Wang et al. | 324/252 |
| 6,661,625 | B1 * | 12/2003 | Sin et al. | 360/324.2 |
| 6,753,618 | B2 * | 6/2004 | Basceri et al. | 257/296 |
| 6,815,784 | B2 * | 11/2004 | Park et al. | 257/421 |
| 6,819,532 | B2 * | 11/2004 | Kamijo | 360/324.11 |
| 6,930,013 | B2 * | 8/2005 | Choi et al. | 438/396 |
| 6,974,708 | B2 * | 12/2005 | Horng et al. | 438/3 |
| 2005/0170532 | A1 | 8/2005 | Horng et al. | |

FOREIGN PATENT DOCUMENTS

JP   02002164506 A  *  6/2002

OTHER PUBLICATIONS

"Oxygen as a Surfactant in the Growth of Giant Magnetoresistance Spin Valves," by Egelhoff et al., J. of Appl. Phys. 82(12), Dec. 15, 1997, pp. 6142-6151.
"Continuous Thin Barriers for Low-Resistance Spin-Dependent Tunnel Junctions," by Wang et al., J. of Appl. Phys. , vol. 93, No. 10, May 15, 2003, pp. 8367-8369.

(Continued)

Primary Examiner—Zandra V. Smith
Assistant Examiner—Khanh Duong
(74) Attorney, Agent, or Firm—Saile Ackerman LLC; Stephen B. Ackerman

(57) ABSTRACT

A method is provided for forming a magnetoresistive read head with an MTJ configuration having an ultra-thin tunneling barrier layer with low resistance and high breakdown strength. The barrier layer is formed by natural oxidation of an ultra-thin (two atomic layers) Al or Hf—Al layer deposited on an electrode whose surface has first been treated to form an oxygen surfactant layer, the oxygen within the surfactant layer being adsorbed within the ultra-thin layer to produce a uniform and stable $Al_2O_3$ stoichiometry (or HfO stoichiometry) in the tunneling barrier layer.

12 Claims, 2 Drawing Sheets

OTHER PUBLICATIONS

"First Principles Study of Atomic-Scale $Al_2O_3$ Films as Insulators for Magnetic Tunnel Junctions," by Noriko Watori, et al., Japan Journal of Applied Physics, vol. 39, (2000), pp. L479-L481.

Magneto resistance of $Co_{100-x}$ Fe x/Al-Oxide/$Co_{100-x}$FeX Tunnel Junctions; by Eiji Nakashio et al., IEEE Trans. on Magnetics, vol. 36, No. 5, Sep. 2000, pp. 2812-2814.

"Low Resistance Magnetic Tunnel Junctions and Their Interface Structures," by J. Fujikata et al., Journal of Applied Physics, vol. 89, No. 11, Jun. 1, 2001, pp. 7558-7560.

"Progress and Outlook for MRAM Technology," by.S. Tehrani et al., IEEE Trans. on Magnetics, vol. 35, No. 5, Sep. 1999, pp. 2814-2819.

Co-pending HMG-05-043 U.S. Appl. No. 11/317,388, filed Dec. 22, 2005, "MgO/NiFe MTJ for High Performance MRAM Application," assigned to the same assignee as the present invention.

* cited by examiner

METHOD FOR FABRICATING A LOW RESISTANCE TMR READ HEAD

BACKGROUND OF THE INVENTION

1. Field of the Invention

This invention relates to the use of magnetic tunnel junction (MTJ) configurations to form tunneling magnetic read heads (TMR read heads). In particular, it relates to the formation of a low resistance MTJ by use of an under-oxidized tunneling junction layer that is naturally oxidized and formed on an electrode with an oxygen surfactant layer.

2. Description of the Related Art

The magnetic tunnel junction (MTJ) basically comprises two electrodes, which are layers of ferromagnetic material, separated by a tunnel barrier layer, which is a thin layer of insulating material. One of the electrodes, the "pinned" electrode, has its magnetic moment fixed in spatial direction by an adjacent pinning layer (typically a layer of antiferromagnetic material). The other electrode, the "free" electrode, has a magnetic moment that is free to move in the presence of external magnetic fields. Although the tunnel barrier layer between the free and pinned electrodes is an insulator, it is sufficiently thin so that there is a small but finite probability for charge carriers (typically electrons) to cross the layer by means of quantum mechanical tunneling. Thus, a probability dependent current can flow between the free and pinned electrodes. The tunneling probability is spin dependent, depending on the orientation of the conduction electron spin relative to the magnetization direction of each of the ferromagnetic layers. Thus, if these magnetization directions are varied relative to each other, the tunneling current will also vary as a function of the relative directions for a given applied voltage. When used as a read head, the magnetization of the free electrode varies with the external magnetic field of the recorded medium and the resulting change in current is sensed by appropriate circuitry. The MTJ is already being successfully used as a read head. Fontana, Jr. et al (U.S. Pat. No. 5,901,018) disclose a MTJ magnetoresistive read head with a free magnetic layer that also functions as a flux guide to direct magnetic flux from the recording medium to the tunnel junction. The tunnel barrier layer taught by Fontana is formed by depositing and then plasma oxidizing a 0.5-2 nm Al layer to form a layer of $Al_2O_3$. Wang et al. (U.S. Pat. No. 6,462,541 B1) discloses sensing arrangment formed of a plurality of magnetic field sensors, each one generally formed of two magnetically permeable films separated by an intermediate layer of non-magnetic material. Mao et al. (U.S. Pat. No. 6,411,478 B1) teaches the formation of an MTJ type read sensor whose layer structure is horizontal rather than vertical so as to achieve a thinner overall fabrication.

For a read head to operate successfully with recording densities greater than 100 Gb/in$^2$, it should have the following properties:

a) Very low junction resistance R for a given junction area A, (the product, RA, being less than or equal to 1 $\Omega\mu m^2$)
b) High ratio of dR/R (>10%)
c) High dielectric breakdown voltage (>0.5 volts)

For a typical junction area: A=0.01 $\mu m^2$, R must be approximately 100 $\Omega$ for the tunneling magnetoresistive junction (MTJ). For reference, R for a typical GMR sensor (not an MTJ) of this size is approximately 50 $\Omega$.

It is known that ultra-low junction resistance can be obtained only with an ultra-thin tunneling barrier. $Al_2O_3$ is known to be an insulator with a relatively wide band gap even when formed as an ultra-thin layer less than two atomic layers thick (<6 angstroms). Tunneling junctions using this material have been formed by a process of naturally oxidizing a thin layer of aluminum. In this regard, Gallagher et al. (U.S. Pat. No. 6,226,160) teach a method of thermally oxidizing a layer of Al between 5-9 angstroms thick deposited on a fixed ferromagnetic layer, which does not oxidize the surface of the fixed ferromagnetic layer on which the oxide layer is formed. HfAlOx has also been shown to have very low resistance at thin layer formations and the natural oxidation of a thin layer of HfAl has produced an RA as low as 0.6 $\Omega\mu m^2$ and dR/R of approximately 10%. Of the three requirements, a), b) and c), mentioned above, only adequate breakdown voltage has not yet been obtained and is not disclosed in the cited prior art.

SUMMARY OF THE INVENTION

A first object of this invention is to provide a novel MTJ read-head capable of reading recorded densities exceeding 100 Gb/in$^2$.

A second object of this invention is to provide an MTJ read-head having an ultra-low junction resistance, R, where RA (resistance times junction area) is less than 1 $\Omega\mu m^2$.

A third object of this invention is to provide such an MTJ read head having a high magnetoresistive ratio, dR/R, which exceeds 10%.

A fourth object of this invention is to provide such an MTJ read head wherein the tunneling junction has a high breakdown strength.

These objects will be achieved by a fabrication method that forms an ultra-thin tunneling barrier layer of an Al oxide or an Hf/Al alloy oxide on a bottom electrode (pinned electrode) that has first been treated by an oxygen ambient to form an oxygen surfactant layer. The importance of such surfactant layers in the improvement of specular reflection scattering at interfaces of GMR spin valve structures has been demonstrated by W. F. Egelhoff et al., "Oxygen as a surfactant in the growth of giant magnetoresistance spin valves," J. Appl. Phys. 82(12), 15 Dec. 1997 p. 6142. We have found that the prior surfactant formation is also essential to creating the thin barrier layer that has high breakdown voltage in the TMR structure. If the layer is just naturally oxidized, but not formed on a surfactant layer, it will have a tendency to form an aluminum oxide without the proper $Al_2O_3$ stoichiometry and stability to insure high breakdown voltage. The low breakdown strength of such layers which are not formed in accord with the method of the present invention have already been reported by Jianguo Wang et al. "Continuous thin barriers for low-resistance spin-dependent tunnel junctions," J. Appl. Phys. (93)10, 15 May 2003, p. 8367. In the present invention it is found that by combining natural oxidation of an ultra-thin layer which has been formed on an oxygen surfactant layer, the requisite $Al_2O_3$ stoichiometry and barrier layer properties are obtained because both the natural oxidation and the oxygen surfactant layer provides a source of oxygen for the aluminum layer. It is determined experimentally that upon depositing an Al layer on an electrode having an oxygen surfactant layer containing less than an oxygen monolayer, a high quality $Al_2O_3$ is immediately obtained at the interface. During the subsequent natural oxidation to complete the oxidation of the Al layer, the $Al_2O_3$ already formed serves as an oxygen diffusion layer to prevent oxygen from diffusing into the bottom electrode.

More particularly, two structures and methods of fabricating them are provided. Structure I) uses an oxidized aluminum layer of approximately 5.75 angstroms thickness, while structure II) uses an oxidized Hf—Al layer wherein the Hf is between approximately 1.5 and 2.5 angstroms thick and the Al is between approximately 3 and 4.5 angstroms thick.

I) NiCr/MnPt/CoFe(10%)/Ru/CoFe(10%)-10Å NiFe(60%)/OSL/5.75Å Al/NOX/10Å NiFe(60%)-NiFe(20%)/Ta or:
NiCr/MnPt/CoFe(10%)/Ru/CoFe(25%)-10Å NiFe(60%)/OSL/5.75Å Al/NOX/10Å NiFe(60%)-NiFe(20%)/Ta

II) Ta/NiCr/MnPt/CoFe(10%)/Ru/CoFe(10%)-10Å NiFe(60%)/OSL/Hf—Al/NOX/10 ÅNiFe(60%)-NiFe(20%)/Ta

The formation of the structures I) and II) will be further discussed and explained in the context of the description of the preferred embodiments presented below.

DESCRIPTION OF THE PREFERRED EMBODIMENTS

The two preferred embodiments of the present invention (I and II above) are each a method of forming a magnetoresistive read head in a magnetic tunneling junction (MTJ) configuration in which an ultra-thin barrier layer is formed with a more stable stoichiometry that gives it a high breakdown voltage together with an ultra-low junction resistance. In the first preferred embodiment the barrier layer is formed by the natural oxidation (NOX) of an ultra-thin aluminum layer deposited on a sub-atomic monolayer of oxygen (an oxygen surfactant layer (OSL)) that was formed on a bottom electrode surface. The combination of the OSL beneath the Al layer and the NOX of the Al layer produces an oxidized Al layer with $Al_2O_3$ stoichiometry. In the second preferred embodiment, the read head is formed using a naturally oxidized HfAl layer.

Figure 1A:
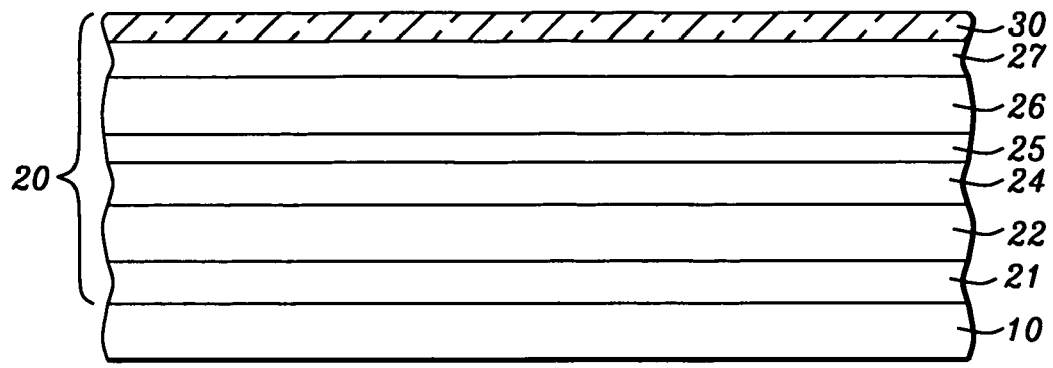
FIGS. 1a-d are schematic illustrations of the processing stages leading to the read-head configuration shown above as I).

Referring first to FIG. 1a, there is shown a cross-sectional view an initial step in the formation of an MTJ device designed to efficiently achieve the objects of the present invention while using a naturally oxidized Al layer as a tunneling barrier layer. There is seen a substrate (10), which in a preferred embodiment of this invention could contain structures to allow electrical connection to a bottom electrode of the MTJ device. On the substrate is then formed a bottom electrode (20), which includes a magnetically pinned layer (22) and which comprises a Ta/NiCr(40%) seed layer (21), wherein the Ta layer provides an advantageous crystalline growth direction for the NiCr, and an MnPt/CoFe (10%)/Ru/CoFe(10%)-NiFe(60%) synthetic antiferromagnetic (SyAF) pinned layer formed on the seed layer, wherein the antiferromagnetic material MnPt (22) provides pinning of two antiferromagnetically coupled ferromagnetic layers CoFe(10%) (24) and the composite layer CoFe(10% or 25%)-NiFe(60%)(26 and 27) coupled by a Ru layer (25). The indicated percentages represent atom percentages of the Fe and Cr in the material composition of the layers. The NiCr(40%) seed layer (21) is formed to a thickness between approximately 30 and 40 angstroms. The CoFe(10%) layer (24) contacting the MnPt layer (22) is formed to a thickness of between approximately 20 and 25 angstroms. The Ru coupling layer (25) is formed to a thickness between approximately 7 and 8 angstroms, the CoFe layer (26) formed on the Ru layer is formed to a thickness between approximately 20 and 25 angstroms. A layer of NiFe(60%) (27) of thickness between approximately 5 and 15 angstroms, with 10 angstroms being preferred, is formed on the CoFe layer (26). It is this NiFe layer (27) which is treated in an oxygen ambient to form an oxygen surfactant layer (OSL) approximately less than 1 atomic monolayer in thickness (30) on its upper surface. The OSL on the upper surface of (27) is indicated as the shaded layer (30). Our experiments suggest that forming the additional NiFe layer is particularly advantageous for achieving the objectives of the present invention because a surfactant monolayer (or sub-monolayer) of oxygen adsorbed on a NiFe layer is more effective for the purposes of the present invention than a surfactant layer of oxygen adsorbed in a CoFe layer. This is because the lower binding energy of oxygen with Fe (as compared to its binding energy with Co) allows the oxygen to be more easily incorporated into the subsequently deposited Al layer and to achieve the stable stoichiometry discussed below. A method for forming an OSL on an exposed surface that achieves the objectives of the invention is as follows:

1. After NiFe(60%) (27) deposition on CoFe layer (26), the entire fabrication is moved into a separate vacuum chamber.
2. The chamber is fed with a small amount of oxygen (approx. 0.02 sccm) to obtain an oxygen pressure of about $2 \times 10^{-7}$ torr.
3. The NiFe(60%) surface is exposed to the oxygen for about 100 s., forming less than a monolayer of oxygen on the surface.

Figure 1B:
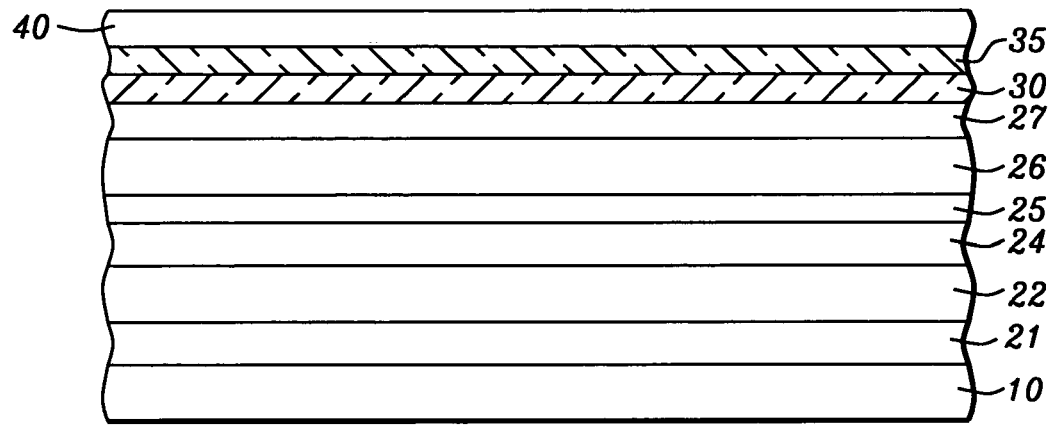

Referring next to FIG. 1b, there is shown the fabrication of FIG. 1a wherein an ultra-thin (2 atomic layers) layer of aluminum (40), between approximately 5 and 6 angstroms thick, with approximately 5.75 angstroms being preferable, is formed on the oxygen surfactant layer (30). The oxygen in the surfactant layer is immediately incorporated within the atomic structure of the Al, creating an $Al_2O_3$ stoichiometry at the interface of the layers (35). The region of oxygen adsorption and $Al_2O_3$ stoichiometry is shown as shaded (35).

Figure 1C:
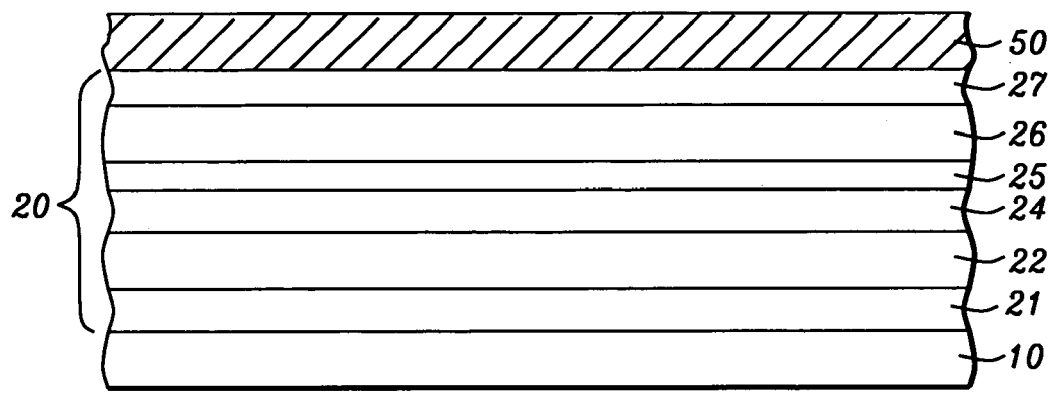

Referring next to FIG. 1c, there is shown the Al layer ((40) in FIG. 1b) after a natural oxidation process (NOX) to complete the formation of an aluminum oxide tunneling barrier layer (50) with approximately $Al_2O_3$ stoichiometry throughout its thickness. During the natural oxidation, the interface portion of the barrier layer ((35) in FIG. 1b) acts as a barrier to oxygen diffusion into the pinned electrode (20). The NOX process occurs in the same chamber as the OSL formation, except that the oxygen is present at higher pressure (between 0.1 torr and 1 torr) and the surface is exposed for corresponding times (between approximately 500 and 200 seconds), with the shorter time being required for the higher oxygen pressure. The OSL layer ((30) in FIG. 1b) is no longer indicated by shading, because ideally the oxygen in that layer would have been adsorbed into the aluminum oxide layer (50) to complete the $Al_2O_3$ stoichiometry. Similarly, the interfacial region ((35) in FIG. 1b) has now merged with the NOX region and layer (50) is, therefore, shown uniformly shaded.

Figure 1D:
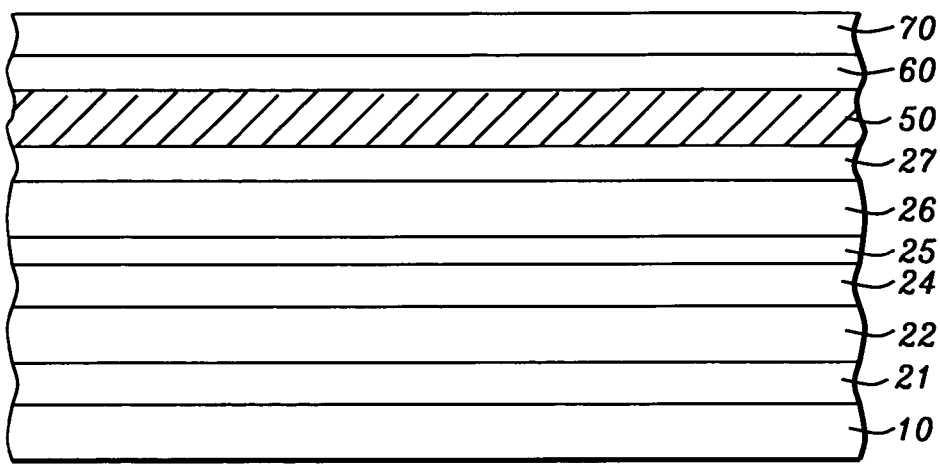

Referring next to FIG. 1d, there is shown schematically the fabrication of FIG. 1c wherein there has been the formation of an upper electrode, which is a ferromagnetic free layer (60), on the tunneling barrier layer (50). Note that layer (50) is now shown with uniform shading to indicate the uniform $Al_2O_3$ stoichiometry that has been achieved by the natural oxidation and the absorption of the oxygen in the OSL. The free layer (60) is a layer of NiFe(60%)-NiFe(20%) having a total thickness between approximately 30 and 50 angstroms, with between approximately 5-10 angstroms of the NiFe(60%) being preferred. A capping layer of Ta (70) is formed on the free layer. It is understood that the fabrication described in the foregoing description will be formed between upper and lower NiFe shield layers which also serve as conducting leads so that a sense current can pass through. An illustration of this lead structure is not provided herein as it can be formed using different methods well known to practitioners of the art.

Figure 2:
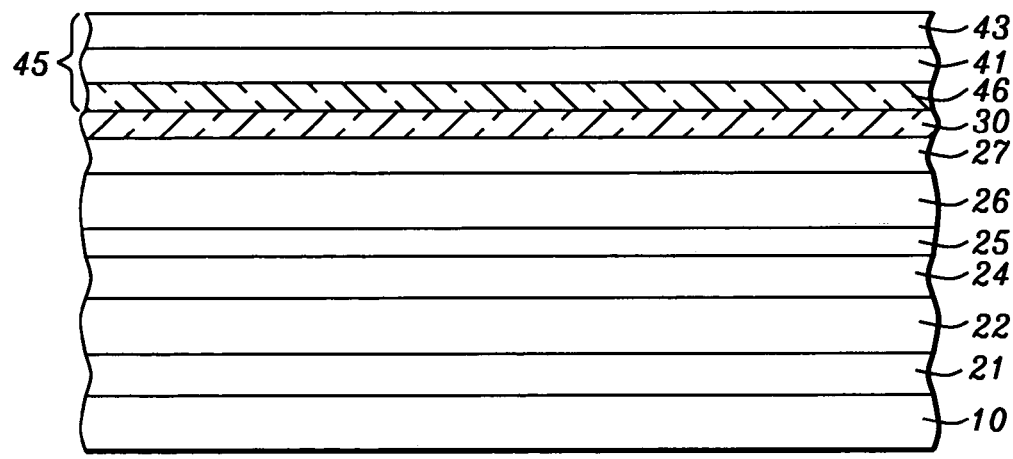
FIG. 2 is a schematic illustration showing how the process steps of FIG. 1b would be changed to produce the device in II).

Referring next to FIG. 2, there is shown the structure of FIG. 1a wherein an alloy layer of Hf—Al (45) has been formed on the oxygen surfactant layer (30). In this, the second embodiment of the present invention, the Hf—Al layer will be naturally oxidized in place of the Al layer of the first embodiment. The Hf—Al layer is formed by first depositing a layer of Hf (41) to a thickness between approximately 1 and 3 angstroms, with 2 angstroms being preferred and then depositing a layer of Al (43) to a thickness between approximately 4 and 5 angstroms on the Hf layer. As a result of this deposition process, the Hf removes oxygen from the surfactant layer more reactively than the Al, since the heat of formation of HfO is higher than that of AlO, to form a stable HfO stoichiometry at the interface (46). In a manner similar to that described with reference to FIG. 1c, the Hf—Al layer is then subjected to a natural oxidation to complete the fully oxidized barrier layer. The subsequent formation of an upper electrode, which is a ferromagnetic free layer, and capping layer on the barrier layer proceed in the same manner as that described in FIG. 1d.

As is understood by a person skilled in the art, the preferred embodiment of the present invention is illustrative of the present invention rather than being limiting of the present invention. Revisions and modifications may be made to processes, materials, structures, and dimensions through which is formed an MTJ read head with ultra-low junction resistance and high junction breakdown voltage, while still providing a method of forming such an MTJ read head in a manner which is in accord with the present invention as defined by the appended claims.

What is claimed is:

1. A method for forming a tunneling magnetoresistive (TMR) read head with a magnetic tunnel junction (MTJ) configuration, wherein said read head has an ultra-thin tunneling barrier layer with ultra-low resistance and high breakdown voltage, comprising:

providing a substrate;

forming on said substrate a lower electrode of magnetic material, said lower electrode having an upper surface;

forming an oxygen surfactant layer on said upper surface of said lower electrode;

forming a tunneling barrier layer on said upper surface of said lower electrode, said formation further comprising:

forming a material layer on said surfactant layer, an interfacial portion of said material layer combining with oxygen within said surfactant layer and said oxygen forming within said interfacial portion an oxide with a uniform and stable stoichiometry thereby;

oxidizing said material layer fully by a process of natural oxidation to form, thereby, a tunneling barrier layer;

forming an upper electrode on said tunneling barrier layer;

forming a capping layer on said upper electrode.

2. The method of claim 1 wherein said lower electrode is a magnetically pinned layer whose formation further comprises:

forming a seed layer on said substrate;

forming a magnetically pinning layer on said seed layer;

forming a synthetic antiferromagnetic (SyAF) layer on said pinning layer, said SyAF layer comprising first and second ferromagnetic layers separated by an antiferromagnetically coupling layer, wherein said first layer contacts said pinning layer and said second ferromagnetic layer is a composite layer having an upper surface on which can be advantageously formed an oxygen surfactant layer.

3. The method of claim 2 wherein said composite layer is formed as a layer of CoFe(10%) or CoFe(25%) of thickness between approximately 15 and 20 angstroms on which is then formed a layer of NiFe(60%) of thickness between approximately 5 and 15 angstroms and wherein said NiFe has a lower binding energy with the oxygen in said surfactant layer than said CoFe.

4. The method of claim 1 wherein said oxygen surfactant layer is formed by a method comprising:

placing said substrate and lower electrode within an evacuated chamber;

feeding said chamber with a small amount of oxygen to obtain an oxygen pressure therein of approximately $2\times10^{-7}$ torr;

exposing said upper surface of said lower electrode to said oxygen for about 100 seconds, forming less than a monolayer of oxygen on said upper surface.

5. The method of claim 1 wherein said material layer is a layer of Al, formed to a thickness of approximately two atomic monolayers.

6. The method of claim 1 wherein said material layer is a layer of Al, formed to a thickness between approximately 5 and 6 angstroms.

7. The method of claim 5 wherein said Al layer combines with the oxygen in said surfactant layer to form a stable $Al_2O_3$ stoichiometry at the interface between said layers.

8. The method of claim 1 wherein said material layer is a composite layer of Hf—Al, wherein the Hf is deposited on said OSL as a layer of thickness between approximately 1 and 3 angstroms and the Al is deposited on said Hf layer as a layer of thickness between approximately 4 and 5 angstroms.

9. The method of claim 8 wherein the Hf layer of said composite layer combines with the oxygen in said surfactant layer to form a stable HfO stoichiometry.

10. The method of claim 1 wherein said material layer is naturally and completely oxidized by a process further comprising:

placing said substrate and said lower electrode having said material layer with said oxidized interfacial portion formed thereon within an evacuated chamber;

feeding said chamber with an amount of oxygen to obtain an oxygen pressure therein between approximately 0.1 and 1 torr;

exposing said material layer to said oxygen for a time between approximately 500 seconds and 200 seconds, wherein said longer time corresponds to said lower pressure and said shorter time corresponds to said higher pressure.

11. The method of claim 1 wherein diffusion of oxygen into said lower electrode during said process of natural oxidation is prevented by said interfacial portion of stable stoichiometry.

12. The method of claim 6 wherein said Al layer combines with the oxygen in said surfactant layer to form a stable $Al_2O_3$ stoichiometry at the interface between said layers.

* * * * *

UNITED STATES PATENT AND TRADEMARK OFFICE
CERTIFICATE OF CORRECTION

PATENT NO.       : 7,264,974 B2                                Page 1 of 1
APPLICATION NO.  : 10/768917
DATED            : September 4, 2007
INVENTOR(S)      : Cheng T. Horng and Ru-Ying Tong It is certified that error appears in the above-identified patent and that said Letters Patent is hereby corrected as shown below:

Title Page, in the Title (54), delete, "METHOD FOR FABRICATING A LOW RESISTANCE TMR READ HEAD" and replace with -- NOVEL OXIDATION METHOD FOR FABRICATING A LOW RESISTANCE TMR READ HEAD --.

Signed and Sealed this

Twenty-third Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,264,974 B2  Page 1 of 1
APPLICATION NO. : 10/768917
DATED : September 4, 2007
INVENTOR(S) : Cheng T. Horng et al.

It is certified that error appears in the above-identified patent and that said Letters Patent is hereby corrected as shown below:

Title Page,
Item [54], Title, the word "NOVEL" (as inserted by Certificate of Correction issued December 23, 2008) should be deleted and title is to be reinstated to read --METHOD FOR FABRICATING A LOW RESISTANCE TMR READ HEAD--.

Signed and Sealed this

Twenty-seventh Day of January, 2009

JOHN DOLL
*Acting Director of the United States Patent and Trademark Office*